United States Patent
Toda et al.

(10) Patent No.: US 8,890,455 B2
(45) Date of Patent: Nov. 18, 2014

(54) ELECTRIC VEHICLE CONTROL DEVICE

(75) Inventors: Shinichi Toda, Tokyo (JP); Ikuo Yasuoka, Tokyo (JP); Yosuke Nakazawa, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 238 days.

(21) Appl. No.: 13/276,154

(22) Filed: Oct. 18, 2011

(65) Prior Publication Data

US 2012/0249032 A1 Oct. 4, 2012

(30) Foreign Application Priority Data

Mar. 31, 2011 (JP) .................................. 2011-080240

(51) Int. Cl.
| | |
|---|---|
| G05B 11/32 | (2006.01) |
| H05K 7/02 | (2006.01) |
| B60L 3/00 | (2006.01) |
| H02P 3/24 | (2006.01) |
| B60L 15/00 | (2006.01) |
| B60L 9/16 | (2006.01) |
| B60L 11/00 | (2006.01) |
| B60L 11/18 | (2006.01) |
| B60L 3/04 | (2006.01) |
| H01L 25/18 | (2006.01) |

(52) U.S. Cl.
CPC ............... *B60L 3/003* (2013.01); *Y02T 10/644* (2013.01); *B60L 2220/14* (2013.01); *Y02T 10/648* (2013.01); *B60L 2240/525* (2013.01); *B60L 3/0069* (2013.01); *Y02T 10/7002* (2013.01); *H02P 3/24* (2013.01); *B60L 15/007* (2013.01); *B60L 9/16* (2013.01); *B60L 2210/40* (2013.01); *Y02T 10/646* (2013.01); *B60L 2200/26* (2013.01); *H01L 25/18* (2013.01); *B60L 11/005* (2013.01); *B60L 11/1803* (2013.01); *Y02T 10/7005* (2013.01); *B60L 2240/36* (2013.01); *Y02T 10/7241* (2013.01); *B60L 3/04* (2013.01)
USPC ................... 318/400.26; 318/400.27; 318/34; 361/760; 361/736; 361/703; 361/600

(58) Field of Classification Search
CPC ...................... H01L 294/1433; H02K 11/0073
USPC ........... 318/34, 901, 400.27, 625, 51, 400.26; 361/600, 601, 760, 736, 701, 704, 713, 361/676, 679.46, 679.47, 688; 180/65.6; 257/712, 713, 723, 724
See application file for complete search history.

(56) References Cited

U.S. PATENT DOCUMENTS

| | | | |
|---|---|---|---|
| 4,161,016 A | 7/1979 | Born et al. | |
| 4,962,341 A * | 10/1990 | Schoeff | 326/43 |

(Continued)

FOREIGN PATENT DOCUMENTS

| | | |
|---|---|---|
| EP | 2 023 473 A2 | 2/2009 |
| EP | 2 157 685 A1 | 2/2010 |

(Continued)

OTHER PUBLICATIONS

International Search Report for PCT/JP2011/058104 dated May 17, 2011 in 9 pages.

(Continued)

*Primary Examiner* — Rita Leykin
(74) *Attorney, Agent, or Firm* — Knobbe, Martens, Olson & Bear, LLP

(57) ABSTRACT

Disclosed herein are electric vehicle control device which can distribute the heat generated by the semiconductor devices in the DC/AC converter efficiently. Also disclosed herein are methods of converting DC to AC while keeping the heat value of the semiconductor devices stable.

6 Claims, 8 Drawing Sheets

(56) References Cited

U.S. PATENT DOCUMENTS

| | | | |
|---|---|---|---|
| 5,237,494 A | | 8/1993 | Baader et al. |
| 5,619,111 A | * | 4/1997 | Katagiri et al. ............... 318/625 |
| 5,740,015 A | * | 4/1998 | Donegan et al. ............. 361/699 |
| 5,923,135 A | | 7/1999 | Takeda |
| 6,431,297 B1 | * | 8/2002 | Nakazawa ................... 180/65.6 |
| 6,838,839 B2 | | 1/2005 | Goto et al. |
| 6,930,893 B2 | * | 8/2005 | Vinciarelli ...................... 363/17 |
| 7,541,758 B2 | | 6/2009 | Inaba et al. |
| 7,561,429 B2 | | 7/2009 | Yahata et al. |
| 7,567,053 B2 | | 7/2009 | Hauenstein |
| 7,960,937 B2 | * | 6/2011 | Sumida et al. ................ 318/801 |
| 7,978,488 B2 | | 7/2011 | Tanaka et al. |
| 8,058,849 B2 | | 11/2011 | Yoshida et al. |
| 8,074,753 B2 | * | 12/2011 | Tahara et al. ............... 180/65.21 |
| 8,154,160 B2 | * | 4/2012 | Kakuda et al. .................. 310/66 |
| 8,174,833 B2 | | 5/2012 | Kitanaka et al. |
| 2002/0167825 A1 | | 11/2002 | Okayama et al. |
| 2007/0008679 A1 | * | 1/2007 | Takahasi et al. .............. 361/600 |
| 2007/0076355 A1 | * | 4/2007 | Oohama ....................... 361/676 |
| 2008/0129231 A1 | | 6/2008 | Toda et al. |
| 2009/0114462 A1 | | 5/2009 | Tahara et al. |
| 2010/0025126 A1 | | 2/2010 | Nakatsu et al. |
| 2010/0277871 A1 | | 11/2010 | Kitanaka et al. |
| 2012/0248909 A1 | | 10/2012 | Ito et al. |

FOREIGN PATENT DOCUMENTS

| | | | |
|---|---|---|---|
| JP | 11-340393 | | 10/1999 |
| JP | 2002-335680 A | | 11/2002 |
| JP | 2004-018555 A | | 1/2004 |
| JP | 2005-160248 A | | 6/2005 |
| JP | 2005-328619 | | 11/2005 |
| JP | 2005-328619 A | | 11/2005 |
| JP | 2006-49542 A | | 2/2006 |
| JP | 2006-340490 | * | 12/2006 |
| JP | 2006-340490 A | | 12/2006 |
| JP | 2007-294716 A | | 11/2007 |
| JP | 2008-086078 A | | 4/2008 |
| JP | 2009-072049 | | 4/2009 |
| JP | 2009-72049 A | | 4/2009 |
| WO | WO 2008/075418 A1 | | 6/2008 |
| WO | WO 2008/152686 A | | 12/2008 |

OTHER PUBLICATIONS

Written Opinion issued by Singapore Patent Office for SG Patent Application No. 201206913-4 in 11 pages.
Non-Final Office Action issued by United States Patent and Trademark Office on Mar. 20, 2013 in the U.S. Appl. No. 13/614,041—13 pages.
Final Office Action issued by United States Patent and Trademark Office on Jul. 15, 2013 in the U.S. Appl. No. 13/614,041—17 pages.
Non-Final Office Action issued by United States Patent and Trademark Office on Nov. 14, 2013 in the U.S. Appl. No. 13/614,041—18 pages.
Final Office Action issued by United States Patent and Trademark Office on Mar. 13, 2014 in the U.S. Appl. No. 13/614,041—24 pages.
Notification of Reasons for Rejection mailed by Japan Patent Office on May 23, 2014 in the corresponding Japanese patent application No. 2011-080240—8 pages.
Toshiba Background Art Information, undated, in 1 page.

* cited by examiner

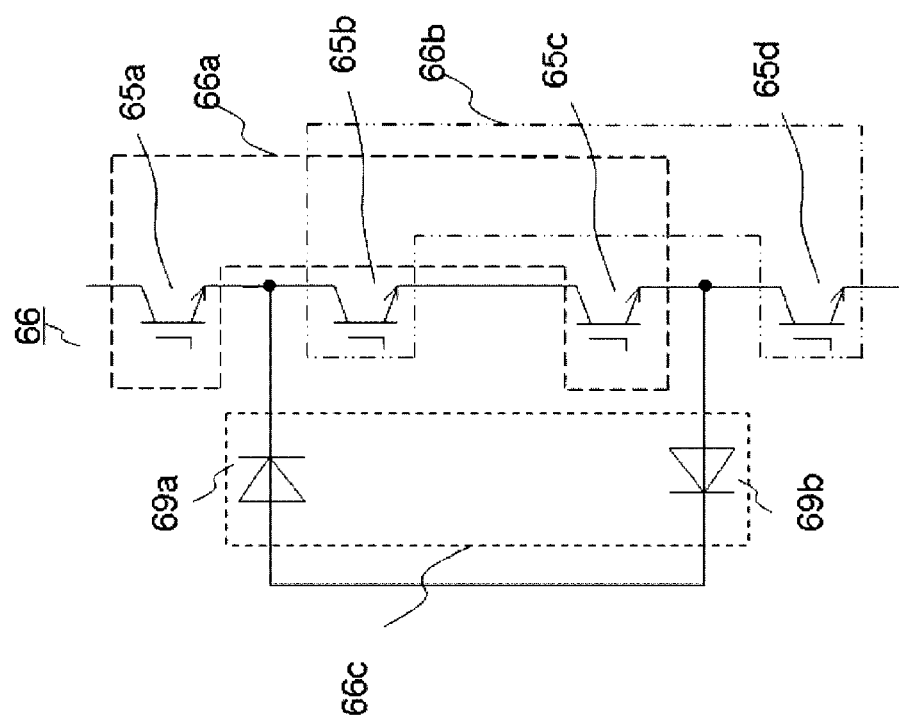

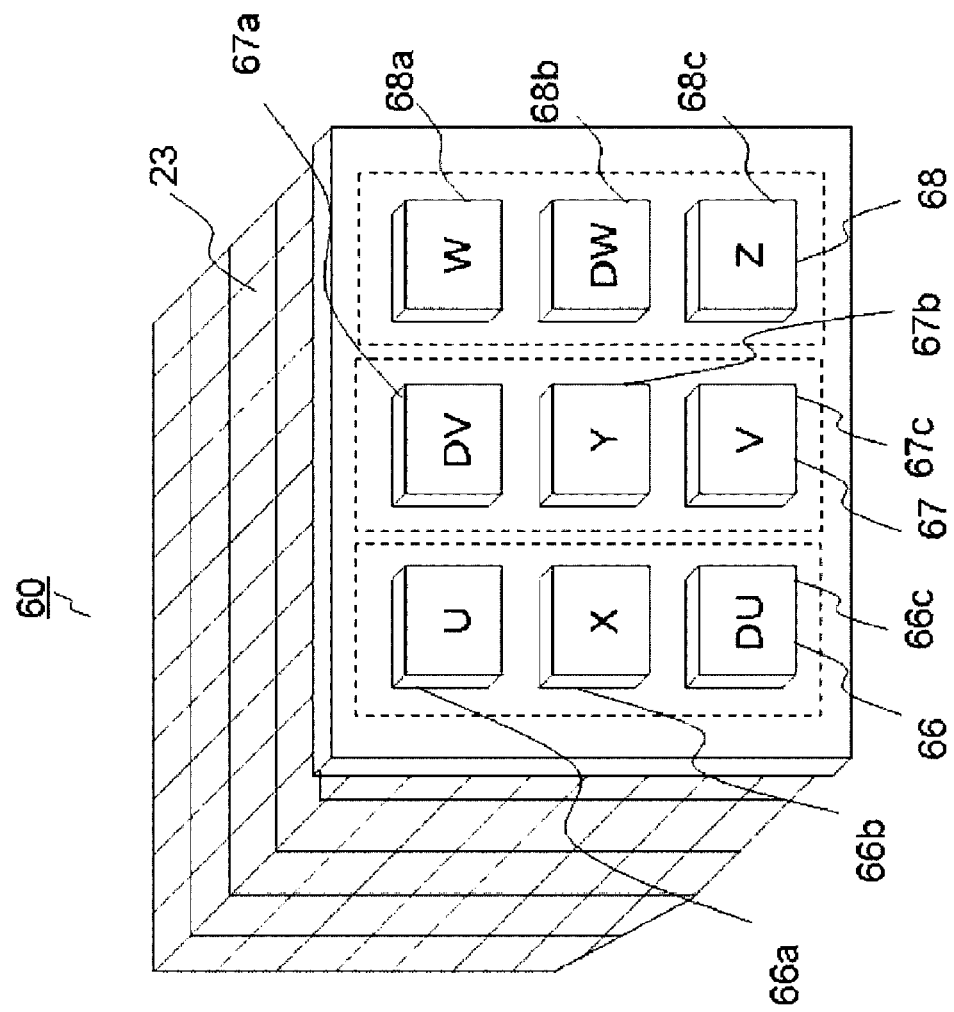

ELECTRIC VEHICLE CONTROL DEVICE

CROSS-REFERENCE TO RELATED APPLICATIONS

This application is, based upon and claims the benefit of priority from Japanese Patent Application No. 2011-080240, filed Mar. 31, 2011, the entire contents of which are incorporated herein by reference.

FIELD

This embodiment is related with the electric vehicle control device which uses a refrigeration unit.

BACKGROUND

Generally the permanent magnet synchronous motor can use energy efficiently as compared with an induction motor. A permanent magnet synchronous motor has less generation of heat than an induction motor. Therefore, the permanent magnet synchronous motor can save weight compared to an induction motor. Therefore, the demand for a permanent magnet synchronous motor is increasing in recent years.

The permanent magnet synchronous motor needs to give and control voltage from a VVVF inverter according to the position of the rotor of each permanent magnet synchronous motor. Therefore, the inverter needs to perform individual control for every permanent magnet synchronous motor. The VVVF inverter of one set each of exclusive use of a permanent magnet synchronous motor has been located. The gate control device was set in each VVVF inverter, in order to control each VVVF inverter.

For this reason, in the system configuration which controls the conventional permanent magnet synchronous motor individually, the number of apparatus increased and enlargement of the whole device and the increase in cost had become a problem.

BRIEF DESCRIPTION OF THE FIG

FIG. 7 is U phase circuit diagram of 3 level power converter of fourth embodiment.

FIG. 8 is an outline view of 3 level power converter of fourth embodiment.

DETAILED DESCRIPTION

To achieve the above-described object, A electric vehicle control device according to the present disclosure comprising a motor, a plurality of inverters comprising a semiconductor device package and a cooler unit to transform DC power to AC power to supply AC power to the motor with switching a semiconductor device, wherein the semiconductor device package stored at least two semiconductor device, wherein the cooler unit connected to semiconductor device package of plurality inverter to cool the semiconductor device package of plurality inverter.

First Embodiment

Figure 1:
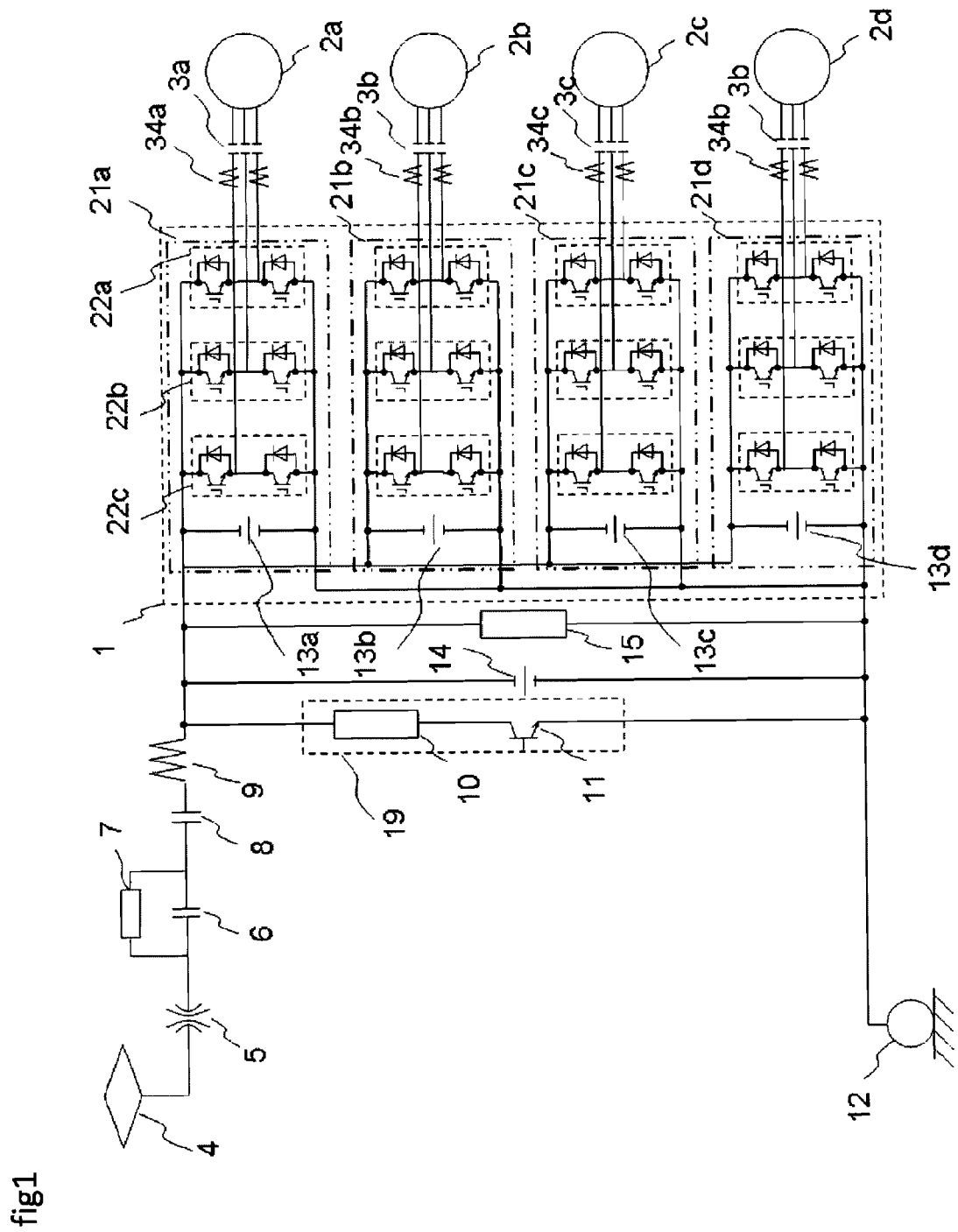
FIG. 1 shows the circuit lineblock diagram of a first embodiment.
Figure 2:
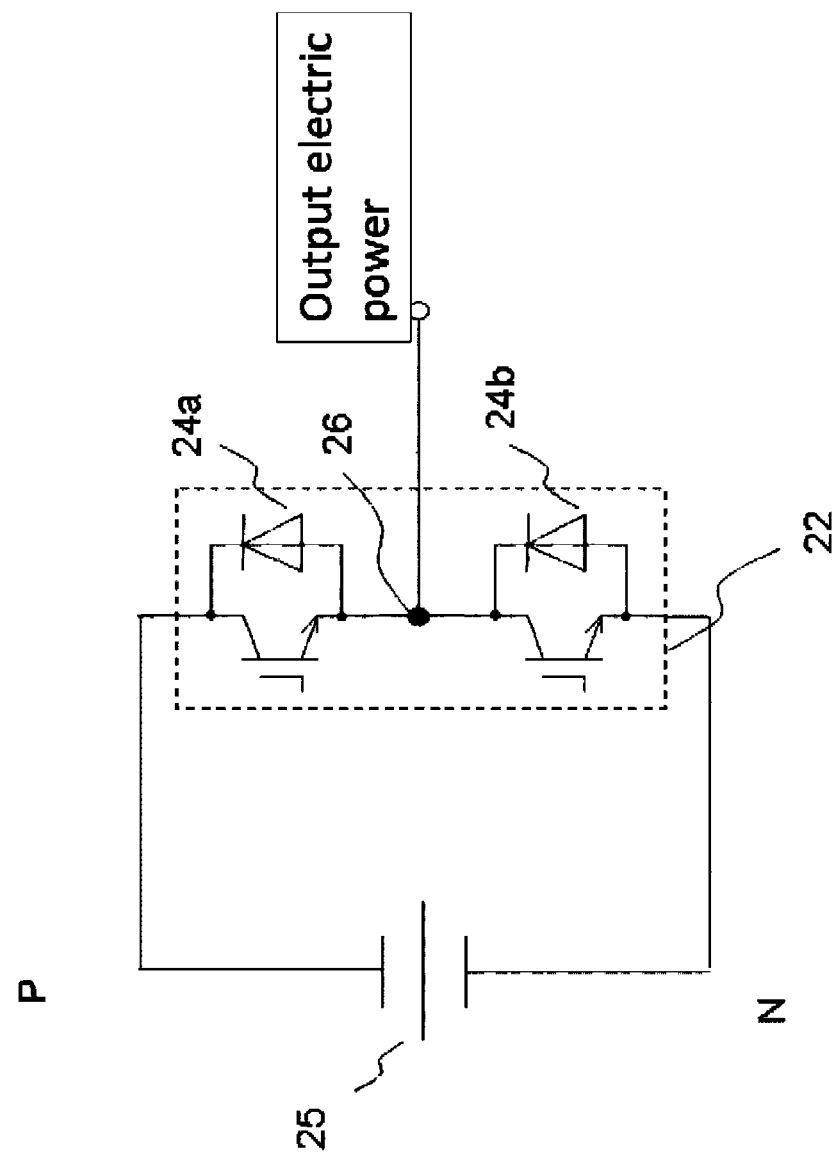
FIG. 2 is a representative circuit schematic of the semiconductor device package of a first embodiment.
Figure 3:
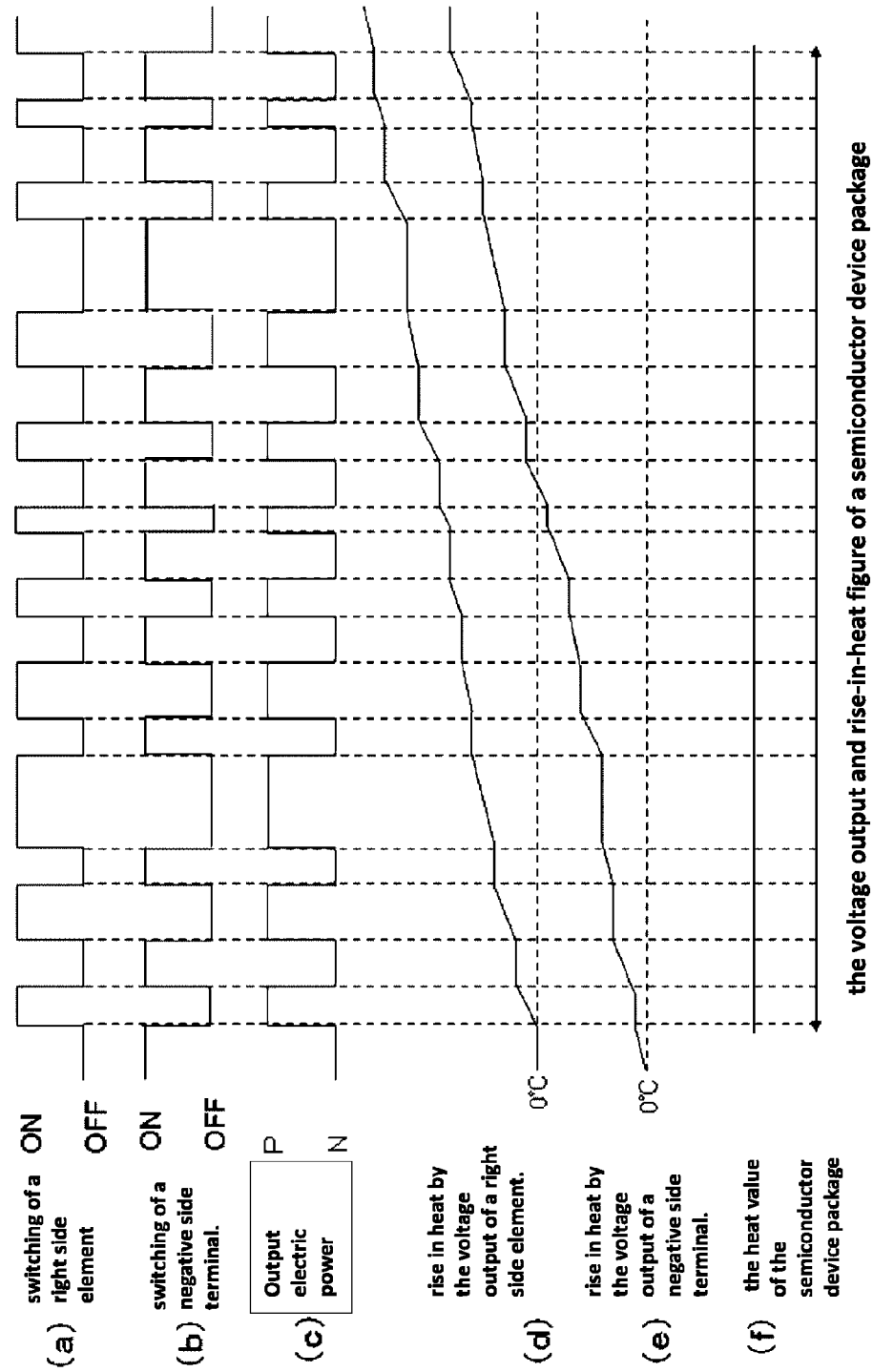
FIG. 3 is the voltage output and rise-in-heat figure of a semiconductor device package of a first embodiment.
Figure 4:
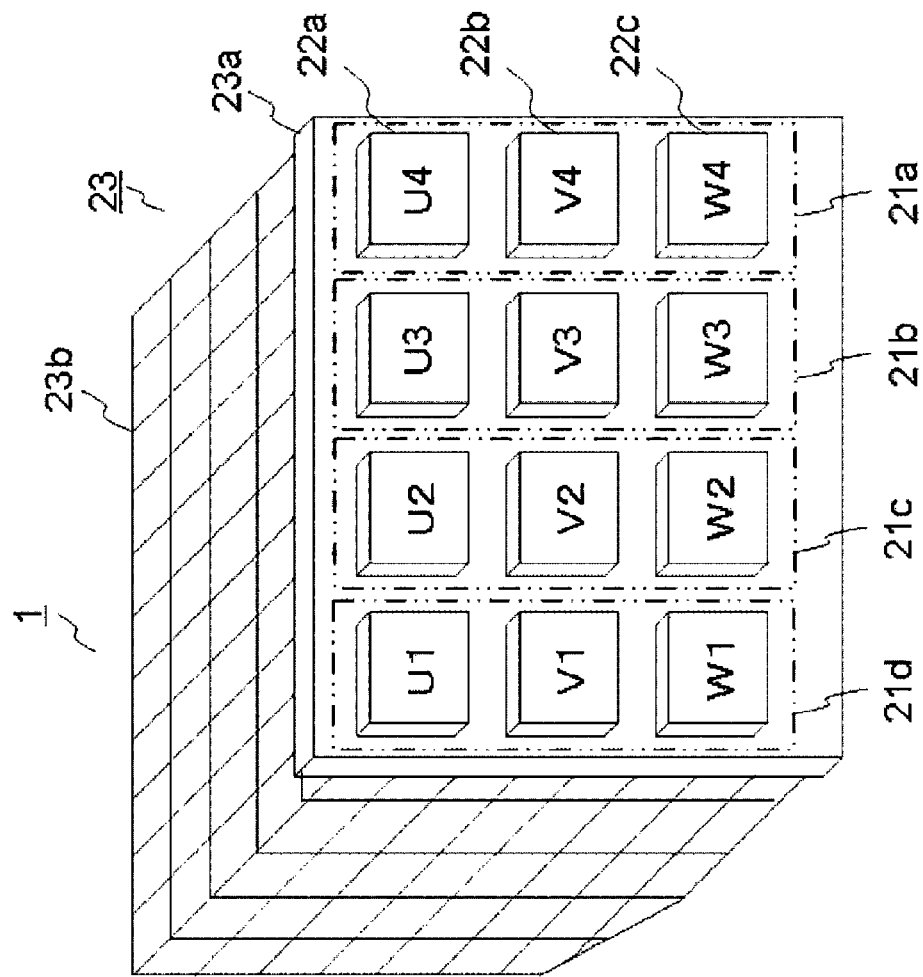
FIG. 4 is an outline view of a first embodiment.

A first embodiment is described with reference to several figures. FIG. 1 is a circuit lineblock diagram of a first embodiment. FIG. 2 is a representative circuit schematic of the semiconductor device package of a first embodiment. FIG. 3 is the voltage output and rise-in-heat figure of a semiconductor device package of a first embodiment. FIG. 4 is an outline view of a first embodiment.

(Element: 4 in 1 Inverter Unit)

With reference to FIG. 1, in the electric vehicle control device of this embodiment, the first 4 in 1 inverter unit's direct-current side comprises current collector 4, high speed circuit breaker 5, short circuit contact machine 6 for charge resistance, charge resistor 7, open contact machine 8, filter reactor 9, excess voltage control resistor 10, switching element 11 for excess voltage control, wheel 12, and filter reactor 14. The alternating current side of a 4 in 1 inverter comprises permanent magnet synchronous motor 2 (2a, 2b, 2c, 2d), motor opening contact machine 3 (3a, 3b, 3c, 3d), and current sensor 34 (34a, 34b, 34c, 34d).

Current collector 4 is connected with high speed circuit breaker 5, and high speed circuit breaker 5 is connected with short circuit contact machine 6 for charge resistance. The parallel circuit which comprises contact machine 6 and resistor 7 is connected with contact machine 8. Contact machine 8 is connected with filter reactor 9. Filter reactor 9 is connected with the end of first 4 in 1 inverter unit 1, and the other end of first 4 in 1 inverter unit 1 is connected with wheel 12. Series circuit 19 for excess voltage control comprises resistor 10 and switching element 11. One terminal side of series circuit 19 is connected between filter reactor 9 and first 4 in 1 inverter unit 1, and, another terminal side of series circuit 19 for excess voltage control is connected between first 4 in 1 inverter unit 1 and wheel 12. Both ends of filter capacitor 14 are connected between direct-current circuit 19 for excess voltage control, and 1st 4 in 1 inverter unit 1. In the alternating current side of first 4 in 1 inverter unit 1, current sensors 34a, 34b, 34c, and 34d are set on 3 phase lines. Four permanent magnet synchronous motors 2a, 2b, 2c, and 2d are connected to first 4 in 1 inverter unit 1 via motor opening contact machines 3a, 3b, 3c, and 3d.

First 4 in 1 inverter unit 1 comprises VVVF inverter 21a, VVVF inverter 21b, VVVF inverter 21c, and VVVF inverter 21d. VVVF inverter 21a, VVVF inverter 21b, VVVF inverter 21c, and VVVF inverter 21d are connected in parallel.

VVVF inverter 21a comprises U phase semiconductor device package 22a, V phase semiconductor device package 22b, W phase semiconductor device package 22c, and filter capacitor 13a for inverters. U phase semiconductor device package 22a, V phase semiconductor device package 22b, and W phase semiconductor device package 22c are connected in parallel. Filter capacitor 13a for inverters is connected to the direct-current side of W phase semiconductor device package 22c in parallel. As for VVVF inverter 21b, VVVF inverter 21c, and VVVF inverter 21d, filter capacitors 13b, 13c, and 13d are connected similarly.

(Elements: Semiconductor Device Package)

FIG. 2 is a representative circuit schematic of a semiconductor device package.

FIG. 3 is a figure showing the switching state of the semiconductor device in a semiconductor device package, and the temperature state of the semiconductor device package by the switching.

As shown in FIG. 2, right side element 24a of an upper arm and lower arm negative side element 24b are connected to semiconductor device package 22 in series. Power supply 25 is connected to the output side of negative side element 24b and the input side of right side element 24a. Voltage is outputted from neutral point 26 of right side element 24a and negative side element 24b. Current flows into right side element 24a from power supply 25 by right side element 24a being set to ON, and negative side element 24b being come by off, and it is outputted from neutral point 26. By right side element 24a being come by off, and negative side element 24b being set to ON, current flows into negative side element 24b from power supply 25, and it is outputted from neutral point 26. A direct current is transformed into an alternating current by repeating such switching.

FIG. 3(a) shows the voltage output by switching of a right side element, and FIG. 3(b) shows the voltage output by switching of a negative side terminal. What compounded FIG. 3(a) and the voltage output of (b) serves as a voltage output of the semiconductor device package 22 whole of FIG. 3(c). FIG. 3(d) shows the graph which showed the rise in heat by the voltage output of a right side element. FIG. 3(e) shows the graph which showed the rise in heat by the voltage output of a negative side terminal. As shown in FIG. 3(d), the temperature of right side element 24a rises, when right side element 24a of FIG. 3(a) is an ON state, and does not rise in an OFF state. Therefore, the temperature of right side element 24a carries out gradual increase by repeating switching operation ON/OFF. As shown in FIG. 3(e), the temperature of negative side element 24b will rise by repeating switching operation ON/OFF of FIG. 3(b) like a right side element. However, the ON state of right side element 24a and the ON state of negative side element 24b are performed one after the other within semiconductor device package 22. Therefore, the heat value of the semiconductor device package 22 whole becomes fixed as shown in FIG. 3(f).

It is 4 in 1 inverter unit 1 which unitized four sets of VVVF inverters 21 which use the above semiconductor device packages 22. FIG. 4 shows the appearance of the device of the first 4 in 1 inverter unit 1. As shown in FIG. 4, 1st 4 in 1 inverter unit 1 is the composition that one cooler structure 23 was installed for four VVVF inverters 21a, VVVF inverter 21b, VVVF inverter 21c, and VVVF inverter 21d. VVVF inverters 21a, 21b, 21c, and 21d are attached to heat-receiving board 23a which composes a part of cooler structure 23. Radiator 23b is connected to the opposite field of which VVVF inverters 21a, 21b, 21c, and 21d of heat-receiving board 23a are attached.

Operation

An operation of the electric vehicle control device of this embodiment is explained. Wire direct-current electric power is supplied to an electric vehicle control device via current collector 4. The direct-current electric power supplied via current collector 4 passes along high speed circuit breaker 5, charge resistor 7, contact machine 8, and filter reactor 9, and is supplied to filter capacitor 14. A Direct current flows into filter capacitor 14 and the filter capacitor (13a, 13b, 13c, 13d) of each inverter connected in parallel. A Direct current's accumulation of sufficient electric charge will throw in contact machine 6.

The direct-current electric power from wire passes along high speed circuit breaker 5, short circuit contact machine 6 for charge resistance, contact machine 7 for opening, and filter reactor 9, and is supplied to first 4 in 1 inverter unit 1.

When direct-current electric power is supplied to first 4 in 1 inverter unit 1, Direct-current electric power is supplied to the semiconductor device which is store in U,V,W phase semiconductor device package 22a, 22b and 22c of VVVF inverter 21a, 21b, 21c, and 21d.

Direct-current electric power is transformed into alternating current electric power by switching of the semiconductor device of VVVF inverter 21. The transformed alternating current electric power is supplied to four permanent magnet synchronous motors 2, and the drive of permanent magnet synchronous motor 2 is started. In this embodiment, when the wire voltage of 1500V is impressed to first 4 in 1 inverter unit 1, the same voltage of 1500V also as VVVF inverter 21a, VVVF inverter 21b, VVVF inverter 21c, and VVVF inverter 21d is impressed. If the voltage of 1500V is impressed to each which is VVVF inverter 21a, VVVF inverter 21b, VVVF inverter 21c, and VVVF inverter 21d, the current will flow into permanent magnet synchronous motor 2, and permanent magnet synchronous motor 2 will be driven.

Thus, although permanent magnet synchronous motor 2 will be in the state which can be driven by the electric energy conversion of the semiconductor device of first 4 in 1 inverter unit 1, but an electric-energy-conversion loss occurs in the case of the electric energy conversion. An electric-energy-conversion loss serves as heat, and is generated from a semiconductor device. The heat generated from the semiconductor device spreads to heat-receiving board 23a. The heat transferred to heat-receiving board 23a will spread to radiator 23b, which will radiate heat from radiator 23b to outside.

Therefore, the heat generated by electric-energy-conversion loss will be canceled outside the product, without stopping at the inside of the product. When a control device (not shown) detects a breakdown and one set of VVVF inverter 21 opens breaker 5 within first 4 in 1 inverter unit 1 during the drive of an electric vehicle control device, four sets of all VVVF inverters 21 will be opened.

When direct-current voltage sensor 15 detects that the direct-current electric power supplied to 1st 4 in 1 inverter unit 1 became excessive, a control device turns on switching element 11 and makes direct-current electric power consume by resistor 10. The control device is controlling ON and OFF of switching element 11 by the output of a direct-current voltage sensor.

Effect

The electric vehicle control device composed in this way can be cooled more efficiently than the conventional radiator, because the heat value of first 4 in 1 inverter unit 1 is also equalized with the whole device, although electric-energy-conversion units of plurality are stored. When the semiconductor device was being individually installed in radiator 23b like before, the installing space of 24 semiconductor devices was needed, but it was able to be considered as 12 installing spaces by using a device package. The operating efficiency of cooler 23 improved by combining two semiconductor devices so that the quantity of heat generated from a device package might become uniform, and installation by a small space was attained.

Part mark have been reduced by making filter reactor 9, excess voltage control resistor 10, and switching element 11 for excess voltage control common in a circuit.

It is also possible to store direct-current voltage sensor 15, current sensors 34a, 34b, 34c, and 34d, and motor opening contact machines 3a, 3b, 3c, and 3d in 4 in 1 inverter unit 1.

It is possible by being able to acquire the same effect as this embodiment also in that case, and storing many devices in one case to simplify wiring and to easy manufacture of the whole device and installation.

It is also possible to delete filter capacitors 13a, 13b, 13c, and 13d, and to work in four sets of VVVF inverters 21 by shared filter capacitor 14 in FIG. 1. It becomes possible to share the right side conductor by the side of a direct current, and the negative side conductor by the side of a direct current between sharing filter capacitor 14 between four sets of VVVF inverters 21 by four sets of VVVF inverters. Therefore, it is more possible than the case where filter capacitors 13a, 13b, 13c, and 13d are installed to reduce part mark.

Second Embodiment

Figure 5:
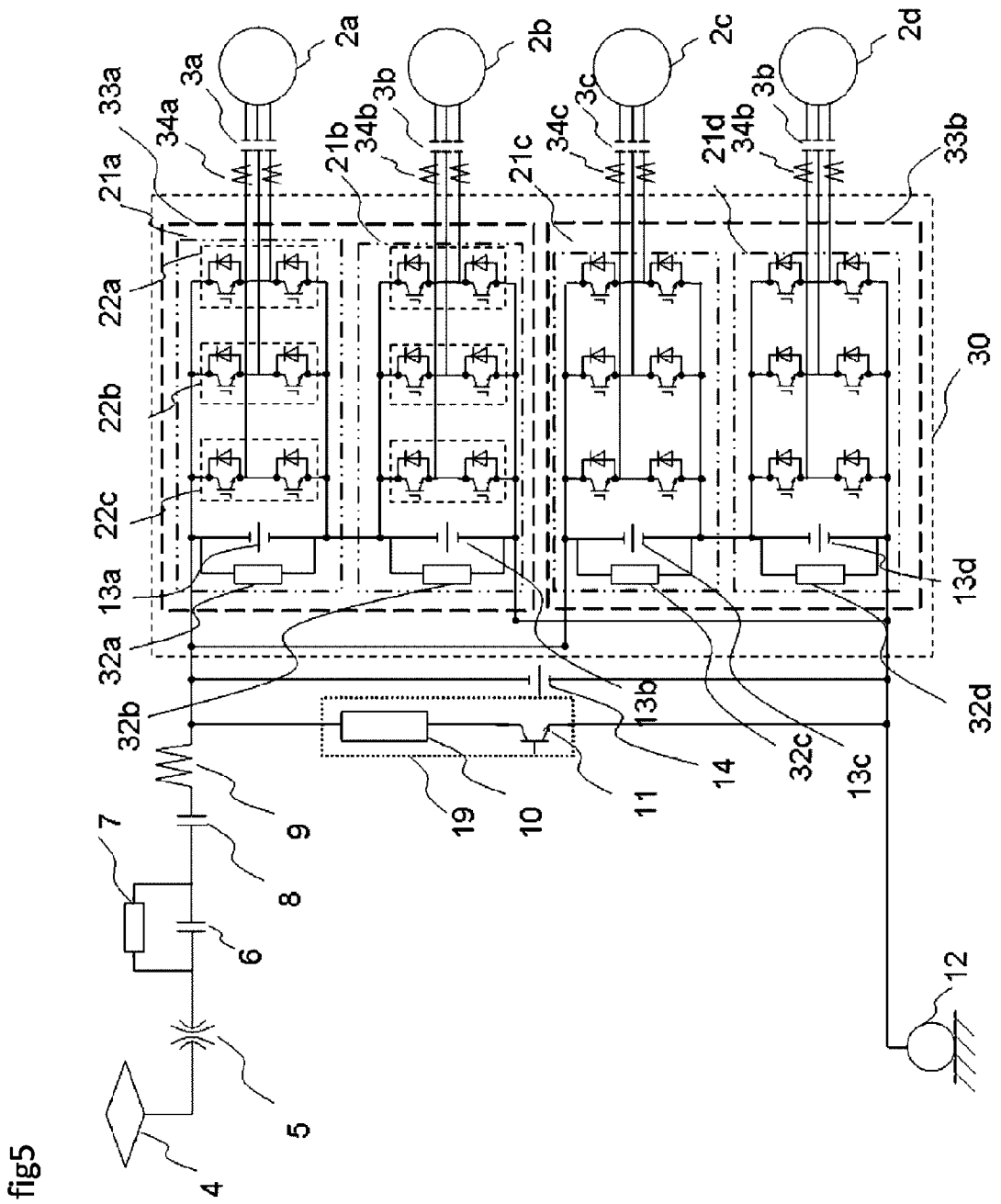
FIG. 5 is a circuit lineblock diagram of a Second Embodiment.

A Second Embodiment is described with reference to figures. FIG. 5 is a circuit line block diagram of a Second Embodiment. About what takes the same composition as FIGS. 1 thru/or 4, a same sign is attached and explanation is omitted.

(Elements)

The connection states of a VVVF inverter and direct current voltage sensors are different between first embodiment of electric vehicle control device and second embodiment. The point is explained below.

The inside of 4 in 1 inverter unit 1 of a second comprises VVVF inverter 21a, VVVF inverter 21b, VVVF inverter 21c, and VVVF inverter 21d. VVVF inverter 21a and VVVF inverter 21b which were connected in series compose inverter series circuit 33a, and compose VVVF inverter 21c and VVVF inverter 21d which were connected in series from inverter series circuit 33b. Inverter series circuit 33a and inverter series circuit 33b are connected in parallel. Filter capacitor 13a for inverters is connected to the direct-current side of W phase semiconductor device package 22c of VVVF inverter 21a. Direct-current voltage sensor 32a is connected to the direct-current side of W phase semiconductor device package 22c in parallel with filter capacitor 13a for inverters. As for VVVF inverter 21b, VVVF inverter 21c, and VVVF inverter 21d, filter capacitors 13b, 13c, and 13d for inverters and direct-current voltage sensors 32b, 32c, and 32d are connected with the same composition as VVVF inverter unit 21a.

Operation

An operation of the electric vehicle control device of this embodiment is explained. For example, when the wire voltage of 1500V is impressed to 4 in 1 inverter unit 30 of a second, the same voltage of 1500V also as inverter series circuits 33a and 33b is impressed. Within inverter series circuit 33a and 33b, the wire voltage of 1500V is divided, and the voltage which is 750V is impressed to each VVVF inverter 21a, VVVF inverter 21b, VVVF inverter 21c, and VVVF inverter 21d.

The current corresponding to the voltage flows and permanent magnet synchronous motor 2 is driven by the current.

In that case, direct-current voltage sensor 32a supervises the voltage state of VVVF inverter unit 21a by detecting the voltage value of filter capacitor 13a for inverters. Direct-current voltage sensor 32b supervises the voltage state of VVVF inverter unit 21b by detecting the voltage value of filter capacitor 13b for inverters. Direct-current voltage sensor 32c supervises the voltage state of VVVF inverter unit 21c by detecting the voltage value of filter capacitor 13c for inverters. Direct-current voltage sensor 32d supervises a VVVF inverter unit's 21d voltage state by detecting the voltage value of filter capacitor 13d for inverters.

Effect of this Embodiment

In addition to the effect of first embodiment, such an electric vehicle control device of composition divided the wire voltage which is impressed to VVVF inverter 21. Therefore, switch a semiconductor device on lower voltage than first embodiment, it becomes possible to reduce the heat generated as an electric-energy-conversion loss.

Miniaturization of cooler structure and energy saving at the time of a device drive can be achieved by generating of heat being reduced.

It can control by detecting the voltage value of each VVVF inverter 21 more correctly using direct-current voltage sensor 32.

Third Embodiment

Figure 6:
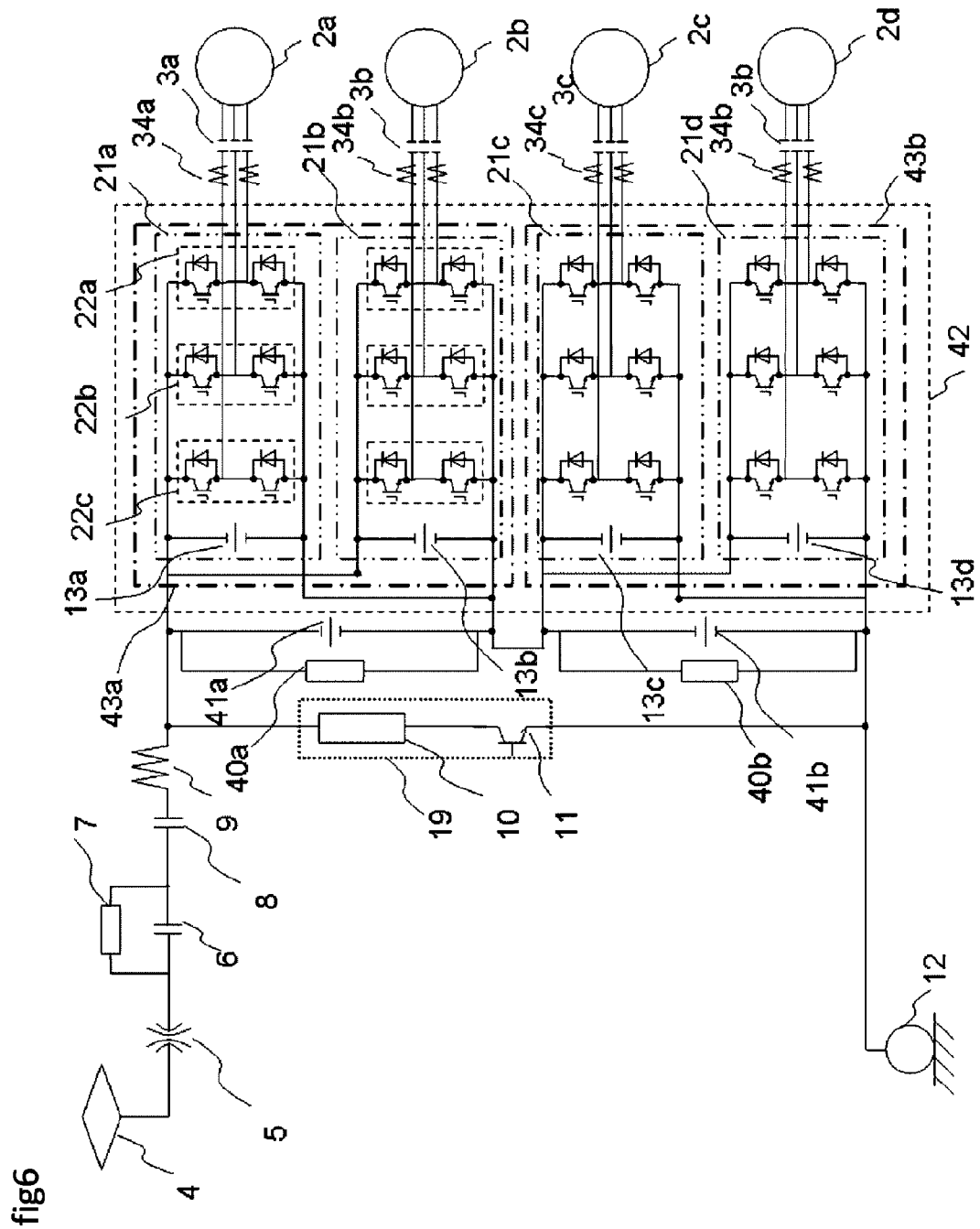
FIG. 6 is a circuit lineblock diagram of a Third Embodiment.

A Third Embodiment is described with reference to figures. FIG. 6 is a circuit lineblock diagram of a Third Embodiment. About what takes the same composition as FIGS. 1 thru/or 4, a same sign is attached and explanation is omitted.

(Elements)

The connection states of a VVVF inverter, direct current voltage sensors and filter capacitor are different between first embodiment of electric vehicle control device and the third embodiment. The point is explained below.

The inside of third 4 in 1 inverter unit 42 comprises VVVF inverter 21a, VVVF inverter 21b, VVVF inverter 21c, and VVVF inverter 21d. VVVF inverter 21a and VVVF inverter 21b which were connected in parallel compose inverter parallel circuit 43a. VVVF inverter 21c and VVVF inverter 21d which were connected in parallel consist of inverter parallel circuits 43b. Inverter parallel circuit 43a and inverter parallel circuit 43b are connected in series. Direct-current voltage sensor 40a connected in parallel with filter capacitor 41a and filter capacitor 41a are connected to the direct-current side of inverter parallel circuit 43a. As for inverter parallel circuit 43b, filter capacitor 41b and direct-current voltage sensor 40b are connected with the same composition as inverter parallel circuit 43a.

Operation

Next, the operation of this embodiment is explained. In this embodiment, when the wire voltage of 1500V is impressed to third 4 in 1 inverter unit 42, the voltage of 750V by which partial pressure was carried out is impressed to inverter parallel circuits 43a and 43b. If the voltage of 750V is impressed to inverter parallel circuits 43a and 43b, the voltage of 750V will be impressed to each which is VVVF inverter 21a, VVVF inverter 21b, VVVF inverter 21c, and VVVF inverter 21d. The current corresponding to the voltage flows and permanent magnet synchronous motor 2 is driven by the current.

Effect of this Embodiment

This embodiment can obtain the same operation as first embodiment. In addition to the effect of first embodiment, such an electric vehicle control device of composition divided the wire voltage which is impressed to VVVF inverter 21. Therefore, switch a semiconductor device on lower voltage than first embodiment, it becomes possible to reduce the heat generated as an electric-energy-conversion loss. Miniaturization of cooler structure and energy saving at the time of a device drive can be achieved by generating of heat being reduced.

Because wire voltage detects the voltage of inverter parallel circuits 43a and 43b by which partial pressure is carried out by direct-current voltage sensors 40a and 40b, a voltage value required for control can be detected, and part mark can be made less than a Second Embodiment.

Fourth Embodiment

Fourth embodiment is described with reference to figures. FIG. 7 is U phase circuit diagram of 3 level power converter of fourth embodiment. FIG. 8 is an outline view of the power converter of fourth embodiment. About what takes the same composition as FIGS. 1 thru/or 4, a same sign is attached and explanation is omitted.
(Elements)

This embodiment applies semiconductor device package 22 of first embodiment to the fourth inverter unit that is a power converter of three levels. Hereafter, the point is explained. As shown in FIG. 7, U phase circuit of 3 level power converter of this embodiment comprises first element 65a, second element 65b, third element 65c, fourth element 65d and first clamp diode 69a, and second clamp diode 69b.

Hereafter, composition of U phase circuit 66 is explained as a example. The first element 65a, the second element 65b, the third element 65c, and the fourth element 65d are U phase series circuits connected in series. First clamp diode 69a and second clamp diode 69b are connected in series. The end of 1st clamp diode 65a is connected between the first element 65a and the second element 65b. The end of clamp diode 65b of a second is connected between the third element 65c and the fourth element 65d. The first element 65a and third element 65c are stored by first U phase semiconductor device package 66a. The second element 65b and fourth element 65d are stored by second U phase semiconductor device package 66b. First clamp diode 69a and second clamp diode 69b are stored by third U phase semiconductor device package 66c. Like U phase circuit 66, first V phase semiconductor device package 67a of V phase circuit 67, V phase semiconductor-device-package 67c, second V phase semiconductor device package 67b and the third reach, first W phase semiconductor device package 68a of W phase circuit 68, second W phase semiconductor device package 68b, and third W phase semiconductor device package 68c are composed.

Next, with reference to FIG. 9, U phase circuit 66, V phase circuit 67, and W phase circuit 68 which are established in heat-receiving board 23a of cooler structure 23, are explained. As shown in FIG. 9, U phase circuit 66 and W phase circuit 68 are located at the end of heat-receiving board 23a, and V phase circuit 67 is arranged between U phase circuit 66 and W phase circuit 68. U phase circuit 66 is located with the permutation of first U phase semiconductor device package 66a, second U phase semiconductor device package 66b, and third U phase semiconductor device package 66c. V phase circuit 67 is located with the permutation of the third semiconductor device package 67c of V phase, the second semiconductor device package 67b of V phase, and the first semiconductor device package 67a of V phase. W phase circuit 68 is located with the permutation of the first semiconductor device package 68a of W phase, the third semiconductor device package 68c of W phase, and the second semiconductor device package 68b of W phase.

Operation

In U phase circuit 66, when a semiconductor device performs switching for electric energy conversion, second element 65b Reaches and the third element 65c of the inductance becomes the largest. Second element 65b of the heat value and the third element 65c of the heat value becomes the largest. Next, the heat value from the first element 65a and fourth element 56d becomes large.

There is least heat value from first clamp diode 69a and second clamp diode 69b. V phase circuit 67 and W phase circuit 68 are also the same. Therefore, the heat value of the first semiconductor device package 66a, 67a, 68a which stored combining the first element 64a and third element 65c is equivalent to the heat value of semiconductor device packages 66b, 67b, and 68b of the second stored combining the second element 65b and fourth element 65d. The heat value of the third semiconductor device package 66c, 67c, 68c which stored combining first clamp diode 69a and second clamp diode 69b is lower than the heat value of the first semiconductor device package 66a, 67a, 68a and the second semiconductor device packages 66b, 67b, 68b.

Effect of this Embodiment

In the electric vehicle control device of this embodiment, the third semiconductor device package 66c, 67c and 68c which have little heat value are located between the first semiconductor device package 66a, 67a, and 68a which have much heat value and the second semiconductor device packages 66b, 67b, and 68b which have much heat value. Therefore, the heat is easy to be equalized with heat-receiving board 2, and it make easy to cool efficiently at cooler guard 23. Therefore, it is able to make 3 level power converter miniaturization, unless 3 level power converter has with many semiconductor devices sets.

The semiconductor device package 22 can apply not only for 4 in 1 inverter unit but also other composition, such as a 2 in 1 inverter unit which comprise two inverter.

While certain embodiments of the invention have been described, these embodiments have been presented by way of example only, and are not intended to limit the scope of the inventions. Indeed, the novel methods and systems described herein may be embodied in a variety of forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An inverter unit for driving electric motors, comprising:
a plurality of inverters, each comprising a U-phase switching package, a V-phase switching package, and a W-phase switching package, configured to generate AC voltage to drive the electric motors, wherein each of the switching packages comprises a positive side switching element and a negative side switching element; and
one cooling device, on which the U-phase switching package, the V-phase switching package, and the W-phase switching package in each of the plurality of inverters are attached, configured to radiate heat from the switching packages,
wherein the U-phase switching package, the V-phase switching package, and the W-phase switching package in each of the plurality of inverters are attached on the cooling device on a line, respectively, and
wherein the switching packages of the same phase are arranged in a same row on the cooling device.

2. The inverter unit of claim 1, wherein the inverter unit comprises four inverters connected in parallel between a positive line and a negative line, wherein the positive line is connected to a current collector and the negative line is connected to a wheel.

3. The inverter unit of claim 2, wherein the inverter unit drives four permanent magnet synchronous motors.

4. The inverter unit of claim 1, wherein the inverter unit comprises a first inverter group including a first inverter connected to a second inverter in series and a second inverter group including a third inverter connected to a fourth inverter in series, and the first inverter group and the second inverter group are connected in parallel with each other between a positive line connected to a current collector and a negative line connected to a wheel.

5. The inverter unit of claim 1, wherein the inverter unit comprises a first inverter group including a first inverter connected to a second inverter in parallel and a second inverter group including a third inverter connected to a fourth inverter in parallel, and the first inverter group is connected to the second inverter group in series between a positive line connected to a current collector and a negative line connected to a wheel.

6. The inverter unit of claim 5, further comprising;
a first filter capacitor connected in parallel to the first inverter group and a second filter capacitor connected in parallel to the second inverter group.

* * * * *